United States Patent [19]

Bristol

[11] Patent Number: 4,667,135
[45] Date of Patent: May 19, 1987

[54] Z-AXIS ORTHOGONALITY COMPENSATION SYSTEM FOR AN OSCILLOSCOPE

[75] Inventor: Lloyd R. Bristol, Tigard, Oreg.

[73] Assignee: Tektronix, Inc., Beaverton, Oreg.

[21] Appl. No.: 464,288

[22] Filed: Feb. 7, 1983

[51] Int. Cl.⁴ .................. H01J 29/56; H01J 29/52
[52] U.S. Cl. .................................... 315/371; 315/383
[58] Field of Search ............ 315/370, 371, 383, 386, 315/30

[56] References Cited

U.S. PATENT DOCUMENTS 2,836,762  5/1958  Ruby et al. ..................... 315/386
3,186,403  6/1965  Bassett ........................... 315/383

Primary Examiner—Theodore M. Blum
Assistant Examiner—Gregory C. Issing
Attorney, Agent, or Firm—George T. Noe

[57] ABSTRACT

A system for correcting display distortion caused by CRT beam current changes in an oscilloscope system is disclosed. A Z-axis signal proportional to the CRT beam current is multiplied by two factors adjustable for either or both of X and Y axes and then added to the respective axis deflection signal which controls CRT beam deflection, thereby providing improved display quality.

2 Claims, 2 Drawing Figures

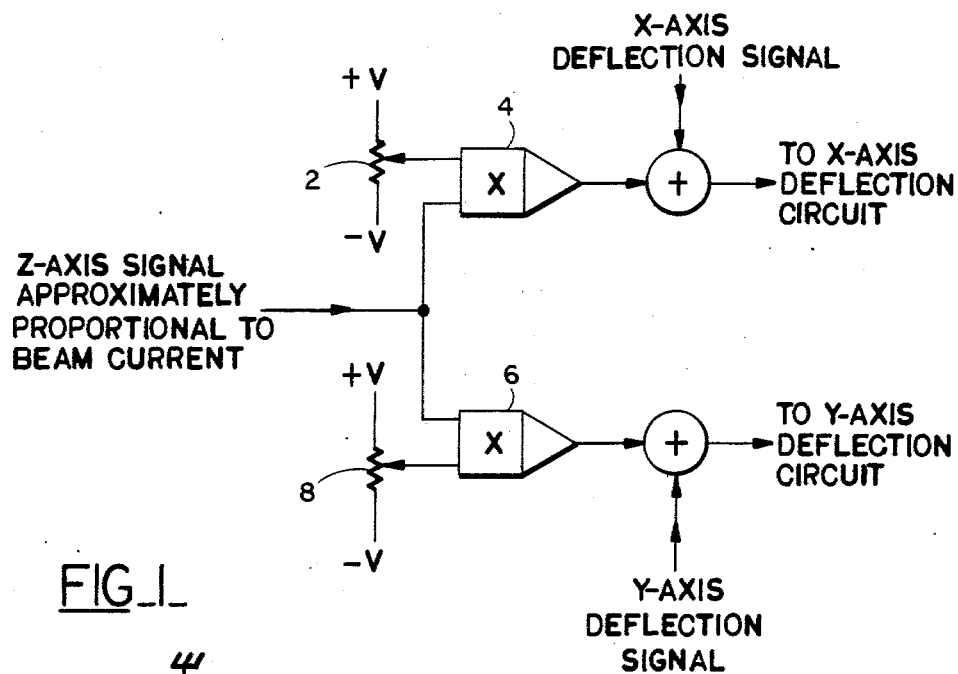
FIG_1_
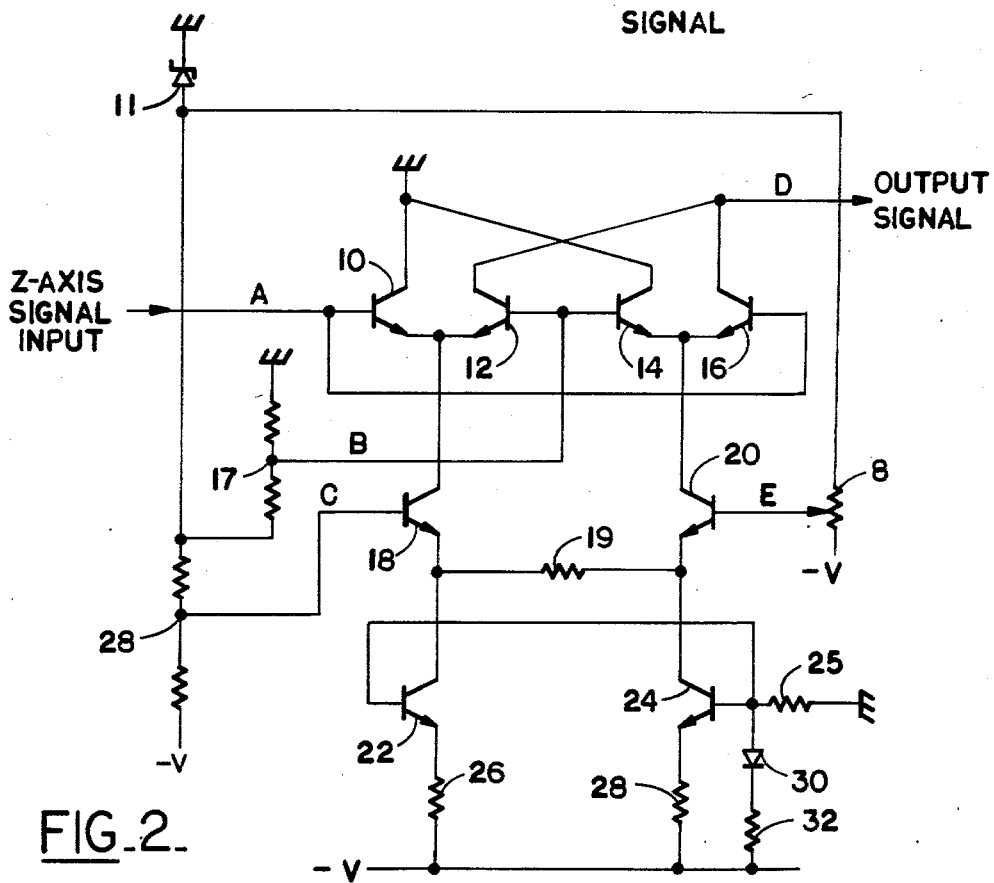
FIG_2_

Z-AXIS ORTHOGONALITY COMPENSATION SYSTEM FOR AN OSCILLOSCOPE

BACKGROUND OF THE INVENTION

The present invention relates generally to a waveform display system, and more particularly to a system for minimizing display distortion caused by changes in electron beam current of a cathode-ray tube (CRT) of an oscilloscope.

In an oscilloscope system, the electron beam of the CRT is deflected horizontally and vertically in response to X-axis and Y-axis deflection signals, respectively, while the CRT beam current is controlled (Z-axis), thus displaying waveforms or alpha-numeric character readout on the CRT screen. The readout is an alpha-numeric character display representing deflection factors or various measurement related information for measurement convenience. The CRT beam current is cut off during sweep retrace, readout blanking in the readout display mode, chop blanking in a so-called CHOP mode, etc. Also, the CRT beam current level is changed in an A intensified by B sweep mode wherein the intensity level is increased during one portion of the main or A sweep, thereby indicating the delayed or B sweep period. Such changes of the CRT beam current induce incidental deflections of the CRT beam due to minor misalignments of various elements of the CRT gun. As a result, undesired display distortion is caused as the CRT beam current changes such that display quality suffers, ground reference is uncertain, timing errors exist, display readout shifts with beam intensity, distortions exist during the A intensified by B sweep display mode, and vertical aberrations occur at the higher portions of the CRT operating curve. The effect is more pronounced in certain high performance CRTs with high beam currents and high deflection sensitivites such as CRTs including quadrapolar scan expansion electrodes or a scan expansion mesh electrode.

SUMMARY OF THE INVENTION

In accordance with the present invention, a pair of multipliers are provided to independently compensate X- and Y-axis deflection signals in response to a Z-axis signal which is approximately proportional to the CRT beam current. The compensated X- and Y-axis deflection signals are applied to X- and Y-axis deflection circuits, respectively, thus improving display quality.

It is therefore one object of the present invention to provide a Z-axis orthogonality compensation system for minimizing display distortion and aberrations due to CRT beam current changes in a waveform display system.

It is another object of the present invention to provide a Z-axis orthogonality compensation system for providing dynamic compensation by the use of multipliers.

It is a further object of the present invention to provide a Z-axis orthogonality compensation system with minimal complexity.

Other objects, features, and advantages of the present invention will become apparent to those skilled in the art by referring to the following description taken in conjunction with the accompanying drawings.

BRIEF DESCRIPTION OF THE DRAWINGS

FIG. 1 is a block diagram of the Z-axis orthogonality compensation system in accordance with the present invention, and FIG. 2 shows one embodiment of the Z-axis orthogonality compensation system of the present invention.

DETAILED DESCRIPTION OF THE INVENTION

Referring to FIG. 1, multipliers 4 and 6 having identical circuit configuration are provided for X and Y axes, respectively. Each multiplier receives two analog inputs and produces an analog output proportional to the product of the two inputs. These multipliers may be any conventional design. One input to each multiplier is a Z-axis signal which is an analog signal which is approximately proportional to the CRT beam current or display intensity. The other input to each mulitplier is a DC voltage signal which is generated by a variable voltage source such as potentiometers 2 and 8 connected between two differnet fixed voltage sources. Potentiometers 2 and 8 are adjusted according to the polarity and magnitude of the Z-axis orthogonality error. X- and Y-axis deflection signals are analog signals for controlling horizontal and vertical deflection of the CRT beam, respectively. The outputs from multipliers 4 and 6 are respectively added to the X- and Y-axis deflection signals to produce compensated X- and Y-axis signals which are applied to X- and Y-axis deflection circuits, respectively. The additions of multiplier outputs to X- and Y-axis deflection signals can be achieved at vertical and horizontal amplifiers, respectively, in the oscilloscope system so that the additional signals to the X- and Y-axis deflection signals control vertical and horizontal positions of the CRT beam to cancel the incidental deflections induced by the CRT beam current changes. Since the compensation circuits are independent for each axis, a CRT requiring compensation along only one axis could be accomodated.

Referring now to FIG. 2, there is shown one example of multiplier 6 and the associated parts thereof. Multiplier 4 and the associated parts thereof are identical to multiplier 6, so this description applies to both multipliers. Emitter-coupled transistors 10-12 and 14-16 form differential pairs. The collectors of transistors 10 and 14 are both grounded. The collectors of transistors 12 and 16 are connected together and provide the output terminal of multiplier 6. The bases of transistors 10 and 16 receive a signal, which is approximately proportional to the CRT beam current and the bases of tansistors 12 and 14 are connected together to a constant voltage node 17. The emitters of the differential transistor pairs 10-12 and 14-16 are respectively connected to the collectors of transistors 18 and 20, which form another differential pair of transistors having a resistor 19 coupled between the emitters thereof. The base of transistor 18 is connected to constant voltage node 21 and the base of transistor 20 is connected to potentiometer 8 connected between a suitable negative voltage supply $-V$ and the anode of Zener diode 11, the cathode of which is grounded. The collectors of transistors 22 and 24 are connected to the emitters of transistors 18 and 20, respectively. The emitters of transistors 22 and 24 are connected to the negative voltage supply $-V$ via resistors 26 and 28. The bases of transistors 22 and 24 are connected together and grounded via common resistor 25. The bases of transistors 22 and 24 are also connected to the negative voltage supply −V via diode 30 and resistor 32. Transistors 22 and 24 are constant current sources. Multiplier 6 produces at output terminal D an output current proportional to the product of the difference between input signals at input terminals A and B, and the difference between input signals at terminals C and E. Since the signals at input terminals B and C are constant, the proportional-to-beam-current signal at input terminal A is amplied in proportion to a factor determined by potentiometer 8. The addition of the compensation signal from multiplier 6 to the Y-axis deflection signal can easily be achieved at the vertical amplifier stage of the oscilloscope system. Similarly, the output of multiplier 4 can be added to the X-axis deflection signal at the horizontal amplifier stage of the oscilloscope system. For example, the compensation signal may be applied to the emitter of a common emitter transistor, the base of which receives an input signal. Alternatively, the compensation signal may be applied to a proportioning resistor network along with an input signal.

According to the present invention, high spped and dynamic compensation for display distortion caused by the CRT beam current changes is a acomplished with minimal complexity. The Z-axis orthogonality compensation system provides improved display quality, reduced ground reference uncertainty, reduced timing error, reduced readout shift with intensity, reduced A intensified by B waveform distortion, and reduced vertical aberrations at high CRT current. Either one axis, or both axes, may be compensated as desired.

While there has been shown and described only one embodiment of the present invention, it will be obvious to those having ordinary skill in the art that many changes may be made without departing from the spirit of the present invention.

What I claim as being novel is:

1. A Z-axis orthogonality compensation system for correcting display distortion caused by changes of cathode-ray tube beam current in a waveform display system, comprising:
    means for receiving a Z-axis signal substantially proportional to said beam current;
    means comprising at least one multiplier circuit for generating a compensation signal by combining said Z-axis signal with an adjustable DC voltage; and
    means for adding said compensation signal to at least one of an X-axis and a Y-axis deflection signal.

2. A system in accordance with claim 1 wherein said means for generating compesation signals comprises a second multiplier circuit which combines said Z-axis signal with a second adjustable DC voltage thereby to generate a second compensation signal, wherein said second compensation signal is added to the other of said X-axis and Y-axis deflection signals.

* * * * *